United States Patent [19]
Österling et al.

[11] Patent Number: 5,870,001
[45] Date of Patent: Feb. 9, 1999

[54] APPARATUS, AND ASSOCIATED METHOD, FOR CALIBRATING A DEVICE

[75] Inventors: Jacob Kristian Österling, Järfälla; Mats Kristian Lindskog, Kista, both of Sweden

[73] Assignee: Telefonaktiebolaget L M Ericsson (publ), Stockholm, Sweden

[21] Appl. No.: 821,114

[22] Filed: Mar. 20, 1997

Related U.S. Application Data

[60] Provisional application No. 60/029,566 Oct. 22, 1996.
[51] Int. Cl.⁶ .................................................... H03L 7/087
[52] U.S. Cl. .................................. 331/11; 331/18; 331/44
[58] Field of Search ................................ 331/2, 9, 18, 34, 331/41, 48, 148, 175, 177 R, 108, 10, 11, 44

[56] References Cited

U.S. PATENT DOCUMENTS

| | | | |
|---|---|---|---|
| 3,621,451 | 11/1971 | Yokoyama et al. | 331/11 |
| 4,001,714 | 1/1977 | Reed | 331/4 |
| 5,389,899 | 2/1995 | Yahagi et al. | 331/10 |
| 5,521,948 | 5/1996 | Takeuchi | 331/11 |
| 5,594,739 | 1/1997 | Lemieux | 570/350 |
| 5,629,649 | 5/1997 | Ujiie | 331/17 |
| 5,748,044 | 5/1998 | Xue | 331/2 |

FOREIGN PATENT DOCUMENTS

| | | |
|---|---|---|
| 0 391 144 A2 | 10/1990 | European Pat. Off. . |
| 2 282 719 A | 4/1995 | United Kingdom . |
| 2 286 300 A | 8/1995 | United Kingdom . |

OTHER PUBLICATIONS

Dr. Cosmo Little, Mr. Clive Green; "*GPS Disciplined Rubidium Oscillator*"; IEEE 1996, European Frequency Time Forum, Mar. 5–7, 1996, Conference Publication No. 418; pp. 105–110.

M.E. Costa, J.W. He, A.S. Mann, A.N. Luiten, and D.G. Blair; "*Combined Sapphire Oscillator—Hydrogen Maser Frequency Standard*"; Electronics Letters, Dec. 8, 1994, vol. 30, No. 25, pp. 2119–2120.

*Primary Examiner*—David C. Nelms
*Assistant Examiner*—Michael T. Tran
*Attorney, Agent, or Firm*—Jenkens & Gilchrist, P.C.

[57] ABSTRACT

Apparatus, and an associated method, for calibrating a device responsive to values of a reference signal. The reference signal may be subject to short-term disturbances. In one implementation, a cellular radio base station utilizes a Stratum-2 oscillator to which to phase-lock a base station VCO. Compensation is made for the aging of the Stratum-2 oscillator, thereby to provide a regulation signal causing the VCO to exhibit acceptable short-term and long-term frequency stability characteristics.

24 Claims, 4 Drawing Sheets

5,870,001

APPARATUS, AND ASSOCIATED METHOD, FOR CALIBRATING A DEVICE

CROSS-REFERENCE TO A RELATED APPLICATION

This application for patent claims the benefit of priority from, and hereby incorporates by reference the entire disclosure of, U.S. Provisional Application for Patent Serial No. 60/029,566, filed Oct. 22, 1996.

The present invention relates generally to calibration methods and apparatus for calibrating a device, such as a VCO (voltage-controlled oscillator) responsive to values of a reference signal. More particularly, the present invention relates to the calibration of a device responsive to a reference signal which exhibits acceptable short-term, frequency stability characteristics but which is susceptible to long-term frequency disturbances. The values of the reference signal are selectively modified with a reference signal which exhibits acceptable long-term frequency stability characteristics but which may be susceptible to short-term frequency disturbances.

An embodiment of the present invention is operable in a PLL (phase-locked loop) circuit of e.g., a cellular radio base station. A network-generated signal, such as a PCM clock signal or a GPS clock signal, is provided to the radio base station. Such a signal exhibits good long-term, frequency stability characteristics but is susceptible to short-term, frequency instability. A local oscillator, such as an OVCXO (oven-voltage controlled crystal oscillator), located in the radio base station, generates a reference signal which exhibits good short-term frequency stability characteristics but is susceptible to long-term frequency instability due to aging of the crystal oscillator. A VCO of the radio base station is locked to the reference signal generated by the OVCXO. The reference signal is modified at selected intervals by the network-generated signal. An oscillating signal generated by the VCO is thereby caused to exhibit acceptable short-term and long-term frequency stability characteristics.

BACKGROUND OF THE INVENTION

Many types of devices must be calibrated, at least at selected intervals, to ensure their proper operation. A VCO (voltage-controlled oscillator) coupled in a phase-locked relationship with a reference signal is exemplary of such a device.

When, e.g., the VCO forms a portion of a PLL (phase-locked loop) circuit, the oscillation frequency of oscillating signals generated by the VCO are locked to that of a reference signal to which the VCO is operably responsive.

Many types of radio communication apparatus utilize VCOs coupled in PLL circuits. Oscillating signals formed by the VCO are used to form transmit signals which are transmitted by transmitter apparatus. And, oscillating signals generated by the VCOs of receiver apparatus, for instance, are used in the reception of receive signals. Acceptable frequency stabilities of the oscillating signals generated by the VCOs are required for proper operation of the radio communication apparatus.

A radio base station operable in a cellular communication system is exemplary of radio communication apparatus which utilizes a VCO coupled in a PLL circuit Acceptable frequency stability of oscillating signals generated by the VCO is required so that downlink signals generated by the radio base station are properly transmitted to a mobile terminal without interfering with other concurrently-transmitted downlink signals. Acceptable levels of frequency stability are similarly required to permit the radio base station to properly receive uplink signals transmitted by mobile terminals to the radio base station.

Operational specifications promulgated by various standard-setting bodies set forth, inter alia, frequency stability requirements within which operation of cellular communication apparatus must comply. Operational specifications for the GSM, PCS 1900, and DCS 1800 mobile cellular radio communication systems all set forth stringent timing accuracies to ensure that radio base stations operable in such systems at least generate signals which exhibit acceptable frequency stability levels.

Compliance with the required timing accuracies set forth in an appropriate operational specification required at a radio base station is assured by using a PI-regulated phase-locked-loop (PLL) circuit. In such a circuit, a VCO is locked to a reference signal of high frequency stability. For instance, a PCM clock signal is sometimes utilized to form the reference signal applied to the radio base station. The PCM clock signal is an 8 kHz reference signal generated by a network operator in a well-controlled environment. ETSI G.823 and G.824 specifications set forth inter alia, allowable levels of jitter in a PCM clock signal. When the PCM clock signal exhibits characteristics which are at least as good as the signal requirements set forth in the appropriate or of such specifications, the radio base station can be operated in compliance with the operational specification promulgated by the appropriate standard-setting body.

The quality of the reference signal is measured in Stratum levels. The Stratum level of a PCM clock signal specifies maximal allowed frequency deviation of the reference signal. The aforementioned ETSI G.823 and G.824 specifications set forth frequency stability standards corresponding to a "Stratum-2" level.

Some networks, however, do not guarantee the reference signal, such as the PCM clock signal, to be always within the requirements set forth in the appropriate one of the ETSI G.823 and G.824 specifications.

A reference signal of a lesser-assured stability level is more inexpensively provided. In some networks, therefore, a reference signal, not guaranteed always to be of a Stratum-2 level is instead provided to the radio base stations. A reference signal of a Stratum-3 level is instead guaranteed to be provided. The reference signal provided by the network to the radio base stations is not assured always to be of a Stratum-2 level, but the reference signal is normally of a Stratum-2 frequency stability level but for intermittent periods. During such periods, the reference signal is of an inadequate, i.e., Stratum-3, frequency stability level. Such a reference signal, therefore, is of good long-term frequency stability characteristics, but is potentially of poor short-term frequency stability characteristics.

To ensure that the frequency stability standards required of operation of the radio base stations are met in such networks, some radio base stations include reference oscillators which generate reference signals of Stratum-2 quality. An OVCXO (oven voltage controlled crystal oscillator) is exemplary of a Stratum-2 oscillator.

An OVCXO, as well as some other types of Stratum-2 oscillators, exhibits short-term frequency stability, but is susceptible to long-term frequency drift caused by aging of the oscillator. Conventionally, such oscillators must be calibrated regularly. Calibration is typically carried out utilizing a manual procedure. Such a procedure is costly, particularly when large numbers of radio base stations of a radio communication system must all be regularly calibrated.

A manner by which the good long-term frequency stability characteristics of a PCM clock signal provided by the network can be used to correct for the aging of the Stratum-2 oscillator positioned at the radio base station would reduce the need to manually calibrate the Stratum-2 oscillator.

More generally, a manner by which to permit a device to be calibrated with a reference signal subject to short term disturbances would be advantageous.

It is in light of this background information related to calibration apparatus and methods that the significant improvements of the present invention have evolved.

SUMMARY OF THE INVENTION

The present invention, accordingly, advantageously provides apparatus, and an associated method, for calibrating a device responsive to values of a reference signal susceptible to short-term disturbances.

In one implementation, an embodiment of the present invention is operable in a phase-locked-loop circuit in which an oscillator to be calibrated is provided with an adjustment signal. The adjustment signal is of a quality to permit the oscillator to form an oscillating signal which exhibits acceptable short-term and long-term frequency stability characteristics. A reference signal generated by a reference source having acceptable short-term, frequency stability characteristics but susceptible to long-term frequency deviation is, at selected intervals, altered responsive to values of a signal generated by a reference source having acceptable long-term, frequency stability characteristics but which may be susceptible to short-term frequency instability. The adjustment signal is formed therefrom and is used to adjust the oscillation frequency of the oscillator.

In one aspect of the present invention, a radio base station of a cellular communication system is coupled to receive a network-generated signal, such as a PCM clock signal. The PCM clock signal exhibits good long-term, frequency stability characteristics but is susceptible to short-term, frequency instability. A Stratum-2 oscillator, such as an OVCXO, forms a portion of the radio base station and generates a reference signal which exhibits good short-term frequency stability characteristics but is susceptible to long-term frequency instability caused, e.g., by aging of the oscillator. Operation of the embodiment of the present invention permits the local oscillator to form a signal which exhibits both long-term and short-term frequency stability characteristics of acceptable levels.

In another aspect of the present invention, an output oscillating signal formed by an oscillator of an oscillating circuit is controlled such that the output oscillating signal is of acceptable long-term and short-term frequency stability characteristics. A first feedback element is coupled to receive the output oscillating signal and to receive a first reference signal. The first reference signal exhibits short-term frequency stability characteristics of at least as good as a first selected stability level. The first feedback element forms a first difference signal representative of the deviation of the output oscillating signal relative to the first reference signal. A second feedback element is coupled to receive the output oscillating signal and to receive a second reference signal. The second reference signal exhibits long-term frequency stability characteristics of at least as good as a second selected stability level. The second feedback element forms a second difference signal representative of deviation of the output oscillating signal relative to the second reference signal. A compensation value generator is coupled to receive the second difference signal and to form a compensation value signal. The compensation value signal is formed responsive to values of the second difference signal when the second reference signal exhibits short-term frequency stability characteristics at least as good as a third selected stability level. A regulator is coupled to receive the first difference signal and at least selectively to receive the compensation value signal. The regulator modifies the first difference signal responsive to the compensation value signal and forms a control signal for controlling the frequency of the oscillator.

In another aspect of the present invention, a phase-locked loop circuit frequency-locks an oscillator of an oscillating circuit. A plurality of reference sources form a plurality of reference signals. Each of the reference signals has a noise component exhibiting a spectral density which have spectral components at different frequencies than the noise components of others of the reference signals. A combiner is at least selectively coupled to receive the reference signals generated by the plurality of reference signal sources. The combiner selectively combines the reference signals to form a resultant signal therefrom. The resultant signal adjusts the frequency of oscillation of the oscillator, thereby to frequency-lock oscillator to oscillate at a selected oscillation frequency.

In these and other aspects, therefore, a method and associated apparatus calibrates a device responsive to values of a reference signal in which the reference signal is subject to short-term disturbances. Values of portions of the reference signal are validated by associating a plausibility value with the portions of the reference signal. Indications of the portions of the reference signal and plausibility values associated therewith are provided to a Kalman observer. Values stored in the Kalman observer are selectively altered responsive to the indications provided to the Kalman observer and the plausibility values associated therewith. A regulation signal is formed responsive to the values stored in the Kalman observer. And, the regulation signal is applied to the device.

DETAILED DESCRIPTION

Figure 1:
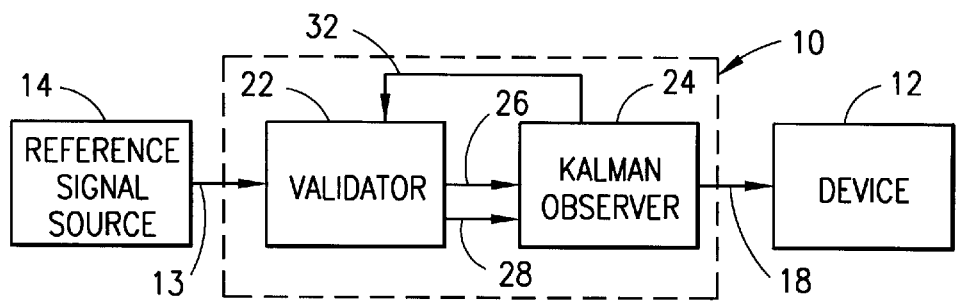
FIG. 1 illustrates a functional block diagram of an embodiment of present invention positioned to calibrate a device.

FIG. 1 illustrates the regulation signal generator 10 of an embodiment of the present invention. The regulation signal generator is operable to generate signals to calibrate a device, here device 12. The regulation signal generator is coupled by way of line 13 to receive a reference signal generated by a reference signal source 14.

The regulation signal generator 10 generates a regulation signal on line 18 which is used to calibrate the device 12. The regulation signal generated on line 18 is of a value selectively responsive to values of the reference signal applied to the regulation signal generator 10 on line 13.

The reference signal generated by the reference signal source 14 is susceptible to short-term disturbances, and the regulation signal generator 10 is operable, in part, to determine when the values of the reference signal are of values which exhibit the short-term disturbances. When portions of the reference signal are of values which indicate that short-term disturbances are introduced thereupon, the values of the portions are not utilized by the regulation signal generator in the formulation of the regulation signal on the line 18.

The regulation signal generator 10 includes a validator 22. The validator 22 is coupled to receive the reference signal generated on the line 13. The validator 22 is operable to validate whether values of the reference signal are likely to be free of short-term disturbances. And, the validator 22 associates a plausibility value with the reference signal value.

The regulation signal generator 10 further includes a Kalman observer 24, here shown to be functionally connected to the validator 22 by way of lines 26 and 28. The Kalman observer 24 is further functionally connected to the validator 22 by way of a loop-back path 32.

In the illustrated embodiment, the Kalman observer models the reference signal source and provides a loop-back confidence interval value by way of the path 32 to the validator 22. Values of the loop-back confidence interval are utilized by the validator 22 to determine the likelihood that the reference signal applied to the validator 22 is free of short-term disturbances.

In one embodiment, the validator 22 buffers sequences of values of the reference signal and determines an average value of the buffered sequence. If the average value is of a value within the values of the loop-back confidence interval, the validator 22 validates the buffered sequence and passes an indication of the average value by way of line 26 to the Kalman observer 24.

The validator 22 is further operable to associate a plausibility value with the buffered sequence. The plausibility value, in one embodiment, is determined responsive to the statistical variance of the average value of the buffered sequence. If the individual values of the buffered sequence are generally close to the average value, the variance of the average value is fairly low and the plausibility value associated with such sequence is fairly high. The plausibility value associated with the buffered sequence validated by the validator 22 is provided, by way of line 28, to the Kalman observer 24.

The Kalman observer 24, as mentioned previously, forms a model of the reference signal source 14. And the regulation signal generated on the line 18 forms an improved version of the reference signal generated by the reference signal source 14. The values of the regulated signal generated by the Kalman observer are altered by selected amounts responsive to the average values of the buffered sequences validated by the validator 22 and applied to the Kalman observer by way of line 26 together with the plausibility value associated therewith and applied to the Kalman observer on line 28.

That is to say, the Kalman observer forms a sequence based upon a model of the reference signal source 14. And, the sequence formed by the model is adjusted responsive to values provided by the validator 22 on the lines 26 and 28. In one embodiment, the amount by which the values formed at the Kalman observer are adjusted and is dependent upon the average value provided on line 26 together with the plausibility value provided on line 28. If the plausibility value is high, for a given average value, the amount by which the Kalman observer alters the sequence formed at the Kalman observer is greater than when the plausibility value is of a lower value.

Thereby, the regulation signal generated on the line 18 used to calibrate the device 12 is formed of values modeled by the Kalman observer, but adjusted by values formed by the validator, when appropriate. When the reference signal generated by the reference signal source 14 exhibits short-term disturbances, signal portions associated therewith are not utilized to adjust values formed by the Kalman observer. And, even if the signal portions are validated by the validator, if the plausibility value associated therewith is low, the amount by which the values formed by the Kalman observer are adjusted is reduced.

Figure 2:
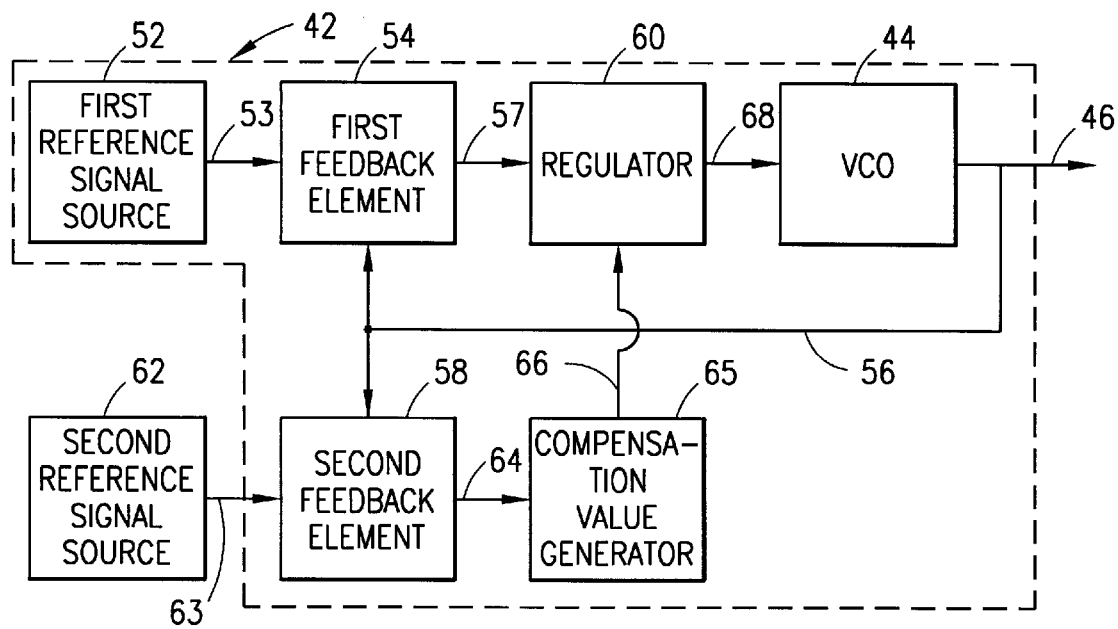
FIG. 2 illustrates a functional block diagram of a phase-locked-loop circuit in which an embodiment of the present invention is operable.

FIG. 2 illustrates a phase-locked-loop circuit, showing generally at 42, in which an embodiment of the present invention is operable. During operation of the phase-locked-loop circuit, the oscillation frequency of a VCO (voltage-controlled oscillator) 44 is controlled so that the oscillator 44 generates an oscillating signal on the line 46 of a desired frequency. Through operation of an embodiment of the present invention, the oscillating signal is caused to be of acceptable long-term and short-term frequency stability characteristics. While the exemplary phase-locked-loop circuit 42 shown in FIG. 2 shall be described with respect to an embodiment in which the circuit 42 forms a portion of a radio base station operable in a cellular communication system, the circuit 42 may alternately form portions of other apparatus. Operation of the circuit 42 can be similarly described with respect thereto.

The phase-locked-loop circuit 42 includes a first reference signal source 52. The source 52 generates a reference signal on line 53 which exhibits good short-term frequency stability characteristics but is susceptible to frequency drift over long time periods. The reference signal source 52 may, for example, be formed of an OVCXO which generates a signal of Stratum-2 quality but which exhibits frequency drift over lengthy periods, e.g., in excess of one year.

The first reference signal generated on line 53 is provided to a first feedback element 54. The oscillating signal generated by the voltage-controlled oscillator 44 is also provided, by way of a feedback line 56, to the first feedback element 54. The feedback element 54 forms a first difference signal on line 57 of values representative of differences between values of the first reference signal generated by the source 52 and the oscillating signal generated by the VCO 44. The first difference signal formed on line 57 is provided as an input to a regulator 60.

The oscillating signal generated by the VCO 44 on the line 46 is also provided, by way of the feedback line 56 to a second feedback element 58. The second feedback element 58 is further coupled to receive a second reference signal generated by a second reference signal source 62 by way of line 63. The second reference signal source 62 exhibits good long-term frequency stability characteristics, but is susceptible to short-term frequency instability.

The second reference signal generated by the signal source 62 is exemplary of a PCM clock signal. As described previously, in some cellular networks, the PCM clock signal is not guaranteed always to be of a Stratum-2 quality. During some periods, referred to as "hold over," the second reference signal is of less than the Stratum-2 quality level.

The second feedback element 58 forms a second difference signal on line 64 representative of phase differences between the second reference signal and the oscillating signal generated by the VCO 44. The second difference signal formed by the second feedback element 58 is provided to a compensation value generator 65.

The compensation value generator 65 is operable to form a compensation signal of values responsive to values of the second reference signal but not of values representative of portions of the second reference signal which exhibit short-term deviation. The compensation signal is provided to a second input of the regulator 60 by way of line 66.

The regulator 60 is operable to form a regulation signal on line 68 for frequency-adjusting the VCO 44. The regulation signal formed by the regulator 60 is of values responsive to values of the first reference signal generated by the first reference signal source 52 which are adjusted at selected intervals by values of the compensation value signal generated by the compensation value generator 65. Long-term frequency drift to which the first reference signal is susceptible is compensated for by the compensation value signal formed responsive to the long-term frequency-stable second reference signal. When such a regulation signal is provided to the VCO 44, the VCO 44 is maintained to oscillate at the desired frequency. As the long-term frequency drift of the first reference signal is compensated for by the compensation value signal, recalibration of the first reference signal source 52 is not necessary. The oscillating signal generated by the VCO 44 on line 46 is thereby caused to exhibit good long-term and short-term frequency stability characteristics.

Figure 3:
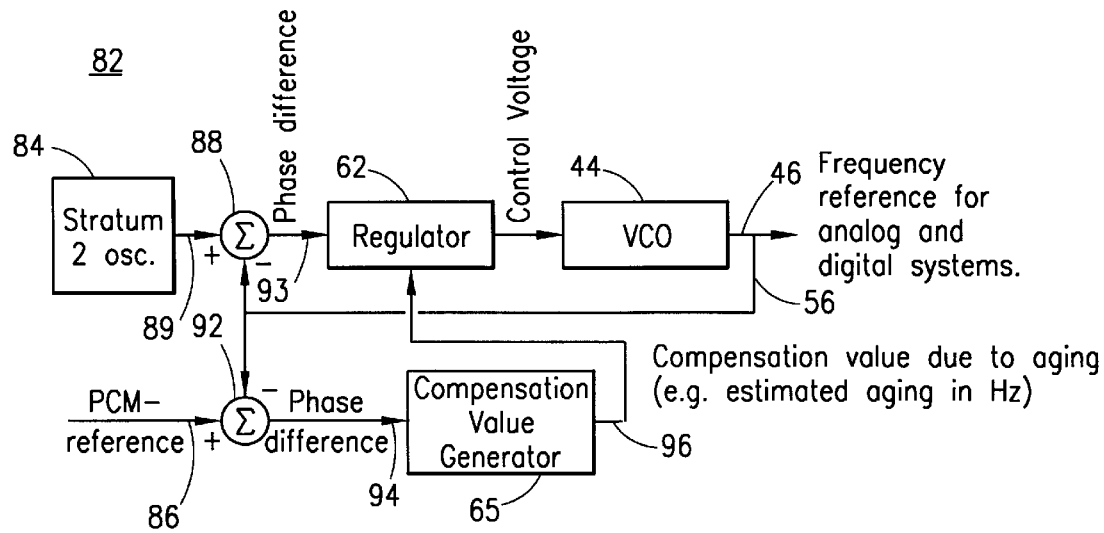
FIG. 3 illustrates a functional block diagram of a PLL in a cellular, radio base station in which an embodiment of the present invention is operable.

FIG. 3 illustrates a phase-locked-loop circuit, here shown generally at 82, embodied at a cellular radio base station. Here again, the oscillation frequency of a VCO 44 is controlled such that an oscillating signal generated on the line 46 is of a desired oscillation frequency. The oscillation frequency of the oscillating signal generated on line 46 is caused, through operation of an embodiment of the present invention, to exhibit acceptable long-term and short-term frequency stability characteristics. The oscillation frequency of the VCO 44 utilizes a short-time-stable, Stratum-2 oscillator 84 in which the reference signal generated therefrom is calibrated utilizing a long-time-stable, PCM clock signal provided to the radio base station in which the PLL 82 is comprised by way of line 86.

The reference signal generated by the oscillator 84 is applied to a first input of a summation device 88 by way of line 89. The oscillating signal generated on the line 46 is provided by way of the feedback line 56 to a second input to the summation device 88. The PCM clock signal generated on the line 86 is provided to a first input of a summation device 92. And the feedback line 56 upon which the oscillating signal is generated is provided to a second input to the summation device 92. The summation devices 88 and 92 each generate phase difference signals. The phase difference signal formed by the device 88 is generated on line 93 and is representative of phase differences between the oscillating signal generated by the VCO 44 and the reference signal generated by the oscillator 84. And, the phase difference signal formed by the device 92 is generated on line 94 and is representative of phase differences between the signal generated by the VCO and the PCM clock signal.

The phase difference signal generated by the summation element is provided to a regulator 62, and the phase difference signal generated by the summation element 92 on line 94 is provided to a compensation value generator 65, here formed of a processing device in which a calibration algorithm is executable. The compensation value generator 65 generates a compensation value signal on line 96 which is provided to a regulator 62.

During operation of an embodiment of the present invention, the compensation value generator 65 determines when the PCM clock signal temporarily deteriorates, e.g., due to holdover in any network elements in the timing hierarchy upon which the PCM clock signal is dependent. During such occurrences, calibration of the reference source 84 is stalled.

At specific time periods, the summation of the two sources are made at the regulator 62. The contribution of the PCM clock signal defines the frequency drift of the Stratum-2 oscillator 84 since a most-recent, prior summation. To calculate the drift, the PCM clock signal is measured. If the PCM clock signal appears to drift away, such drift is actually that of the Stratum-2 oscillator in an opposing direction. The measured drift characteristics of the PCM clock signal are, therefore, the same as the drift of the Stratum-2 oscillator 84. Operation of the compensation value generator 65 determines when the PCM clock signal temporarily deteriorates. During such periods, the compensation value signal is not used by the regulator 62 to calibrate the reference source 84. And, the phase-adjust signal provided by the regulator 62 to the VCO 44 includes calibration components responsive to the compensation value signal when the PCM-reference signal is of good frequency stability characteristics.

Figure 4:
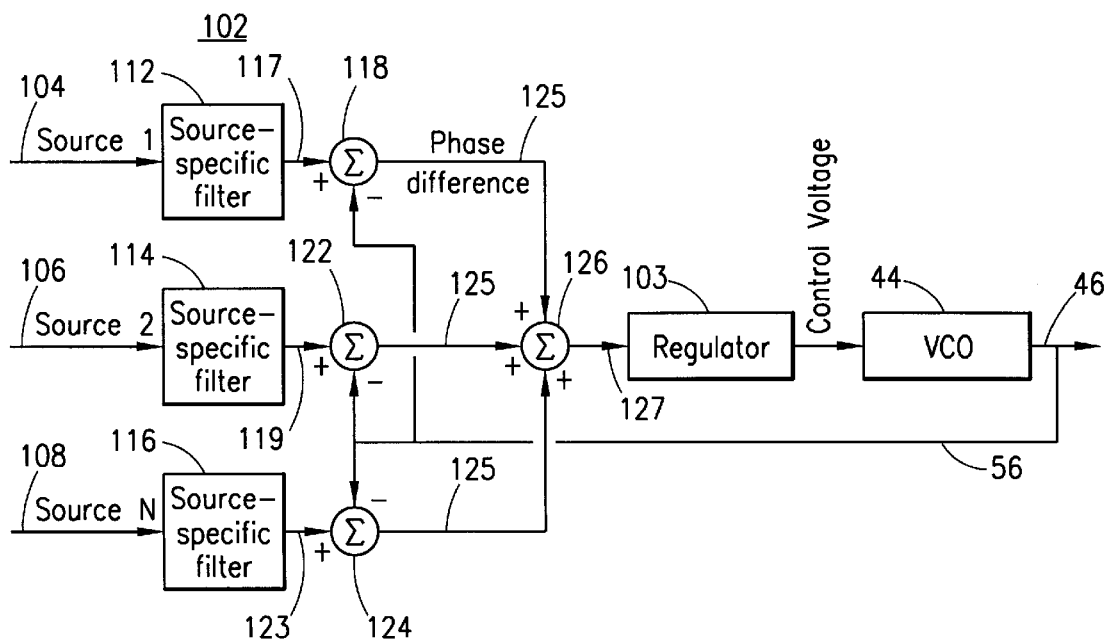
FIG. 4 illustrates a functional block diagram of another phase-locked-loop circuit in which an embodiment of the present invention is operable.

FIG. 4 illustrates a phase-locked-loop (PLL) circuit, shown generally at 102, in which an embodiment of the present invention is also operable. Here again, during operation of the PLL circuit, the oscillating frequency of a VCO 44 is controlled. An oscillating signal is generated by the VCO 44 on the line 46, and a feedback loop 56 provides indications of the oscillating signal in a feedback arrangement. And, the oscillating frequency at which the VCO 44 oscillates is dependent upon an adjustment signal generated by a regulator 103 and applied to the VCO 44.

The PLL circuit 102 is coupled to receive a multiple number, here N, reference source signals. The N reference source signals each exhibit noise, with spectral densities having spectral components positioned at differing frequency intervals.

In the illustration of the figure, three reference source signals on lines 104, 106, and 108 are applied to source-specific filters 112, 114, and 116 respectively. The filters 112, 114, and 116 filter the reference source signals applied thereto.

The filter 112 forms a filtered signal on line 117 which is applied to a first input of a summation element 118. The filter 114 forms a filtered signal on line 119 which is applied to a first input of a summation element 122. And, the filter 116 generates a filtered signal on line 123 which is applied to an input of a summation element 124. The feedback line 56, upon which the oscillating generated by the VCO is formed, is also applied to inputs of the summation elements 118, 122, and 124.

Each of the summation elements 118, 122, and 124 forms a phase difference signal on three separate lines 125. Each of such phase difference signals, in turn, is applied to a summation element 126. The reference source signals are thereby combined in manners dependent upon their respective noise spectral densities to form a single reference signal on line 127 having less noise spectral density than any of the reference source signals alone. Through appropriate selection of the reference source signals, the adjustment signal formed by the regulator 103 causes operation of the VCO 44 to generate an oscillation signal having a long-time stable, low-jitter signal with a high frequency accuracy.

The reference source signals generated upon the lines 104, 106, and 108 can, selectively, be formed of the oscillating signal generated by a Stratum-2 oscillator, such as the oscillator 84 shown in FIG. 3, a PCM clock signal, a GPS (Global Positioning System) signal or a reference signal formed by another type of reference signal source. Analogy can be drawn between the generalized, multi-reference embodiment of the PLL circuit 102 shown in FIG. 4 with the PLL circuit 82 shown in FIG. 3. Viz., the compensation value generator 65 shown in FIG. 3 can be considered to be a source specific filter for the PCM clock signal.

Figure 5:
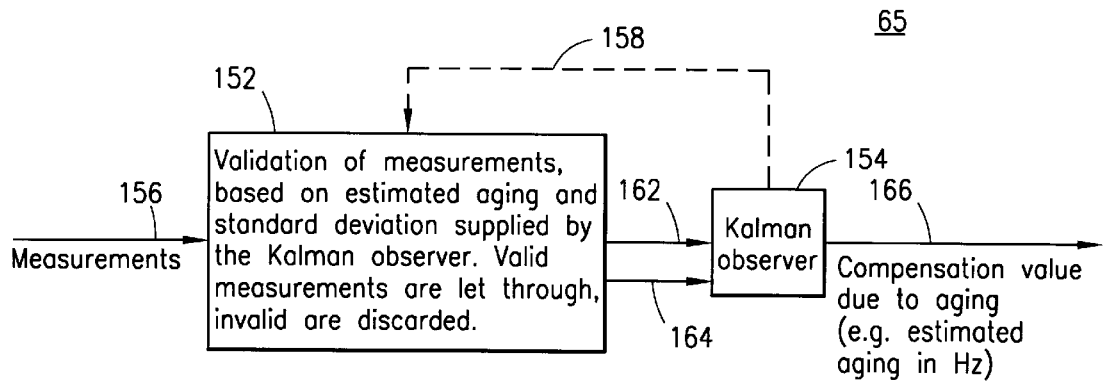
FIG. 5 illustrates a functional block diagram of the compensation value generator of an embodiment of the present invention.

FIG. 5 illustrates a regulation signal generator forming a compensation value generator 65 of an embodiment of the present invention. During operation, the regulation signal generator is operable to calibrate a device, such as the device 12 shown in FIG. 1. In one exemplary implementation, as described with respect to FIGS. 2–4 above, the regulation signal generator forms a compensation value generator 65 of a PLL circuit. While the following description of exemplary operation of the regulation signal generator shall be described with respect to an implementation in which the regulation signal generator forms a compensation value generator 65 of a PLL circuit of a cellular radio base station, operation of the generator can similarly be described with respect to the calibration of devices other than a VCO of a PLL circuit.

The compensation value generator 65 is shown functionally to be formed of a validator 152 and a Kalman observer 154. In one embodiment, the validator 152 and Kalman observer 154 comprise algorithms executable by a processing device. A phase difference signal is provided to the validator 152 by way of line 156. The signal is used to form measurements proportional to the average frequency deviation of the reference signal during each sample period. The validator 152 is further coupled by way of a loop-back path 158 to receive a confidence interval formed by the Kalman observer 154.

The validator 152 is operable to validate the measurements calculated from the phase difference signal applied thereto based upon the confidence interval provided by the Kalman observer by way of the loop-back path 158. Values indicative of portions of the measurements calculated from the phase difference signal determined by the validator to be valid are passed by the validator 152 on the line 162 and provided to the Kalman observer 154. Plausibility values associated with such values are passed by way of line 164. The Kalman observer generates a compensation value on line 166.

The Kalman observer 154 utilizes a model of the aging of a Stratum-2 oscillator. The model forms an estimate of the aging of the Stratum-2 oscillator. Such an estimate, and the standard deviation of the estimate, forms a confidence interval, indications of which are provided by way of the loop-back path 158 to the validator. The validator 152 is thereby able to stall calibration during periods in which the PCM clock link is in holdover. When in holdover, the measurements calculated from the phase-difference signals provided to the validator 152 are of values which are beyond the confidence interval provided to the validator by the Kalman observer 154.

The aging of the Stratum-2 oscillator can be modeled with a state space model defined as follows:

$$\begin{pmatrix} \dot{x}_1 \\ \dot{x}_2 \end{pmatrix} = \begin{pmatrix} 0 & 1 \\ 0 & 0 \end{pmatrix} \begin{pmatrix} x_1 \\ x_2 \end{pmatrix} + \begin{pmatrix} v_1 \\ v_2 \end{pmatrix}$$

wherein:

$x_1$ is the error in hertz;

$x_2$ is the time derivative of the oscillator aging; and $v_i$, i=1,2 are uncorrelated white gaussian noise with spectral density $\Psi_1$ and $\Psi_2$, respectively.

The model is thereby a combination of a step and a ramp, i.e., a line with an offset. Such a model is called an "elevated Allan variance" model and is a short-time description of the aging of an oscillator. Long-time aging can also be represented by a non-linear model, typically a better model, described by the equation:

$$f(t)=f_0(1+A1n(Bt+1))$$

wherein f(t) is the frequency deviation at time t. As the model utilized by the Kalman observer 154 is used between samples provided to the validator 152, the short-time description model of the oscillator is suitably used. Analysis of the long-time aging indicates, however, that aging slows down and is not an accelerative process.

The correspondence between the spectral densities of the white gaussian noise and Allan variance is as follows:

$$\begin{cases} \Psi_1 = 2h_0 \\ \Psi_2 = 8\pi^2 h_{-2} \end{cases}$$

wherein $h_0$ and $h_{-2}$ are the Allan variances for sampling a few decades less and higher than the "flicker floor" in an Allan variance model.

A Stratum-2 oscillator approximately exhibits the Allan variances and spectral densities of:

$$h_0 = 2 * 10^{-20} \quad \Psi_1 = 4 \cdot 10^{-20}$$
$$\text{and}$$
$$h_{-2} = 4 * 10^{-29} \quad \Psi_2 = 3.2 \cdot 10^{-27}$$

During periods of holdover, the PCM clock signal exhibits frequency stability characteristics corresponding to Stratum-2 to Stratum-3 quality levels. A Stratum-3 oscillator exhibits the following Allan variances and spectral densities:

$$h_0 = 8 * 10^{-20} \quad \Psi_1 = 1.6 \cdot 10^{-19}$$
$$\text{and}$$
$$h_{-2} = 4 * 10^{-23} \quad \Psi_2 = 3.2 \cdot 10^{-21}$$

The measured quantity is the aging of the oscillator, $x_1$. Since the noise characteristics are generally dissimilar for each synchronization network, the noise characteristics do not form portions of the model utilized by the Kalman observer 154. The model of the measurements is therefore the same as the model of the oscillator aging, thereby motivating that the device 65 in FIG. 3 can be seen upon as a source-specific filter for the PCM clock signal.

Assuming that the system noise is constant between sampling instances permits transformation of the oscillator model into a discrete time model represented as follows:

$$\begin{pmatrix} x_{1,k+1} \\ x_{2,k+1} \end{pmatrix} = \begin{pmatrix} 1 & T \\ 0 & 1 \end{pmatrix} \begin{pmatrix} x_{1,k} \\ x_{2,k} \end{pmatrix} + \begin{pmatrix} T & T^2/2 \\ 0 & T \end{pmatrix} \begin{pmatrix} \upsilon_{1,k+1} \\ \upsilon_{2,k+1} \end{pmatrix}$$

wherein T is the sample period.

The covariance matrix of the vector $\upsilon_{i,k}$ multiplied with the matrix in front of it in the above-equation is independent of the sample time k and is referred to as Q. The variance of the calculated measurement of the frequency deviation at sample k is referred to as $R_k$.

The Kalman observer 154, in the exemplary embodiment, forms a non-stationary Kalman observer. Such a Kalman observer includes the following state space model:

$$\bar{x}_k = F\bar{x}_{k-1} + v_k \qquad v_k \in N(0, Q)$$
$$y_k = H\bar{x}_k + n_k \quad \text{where} \quad n_k \in N(0, R_k)$$

The non-stationary Kalman observer exhibits a state vector $\hat{x}_k$ which is the estimated state vector of the observed system, based on the measurements 1 to k–1, which minimizes $E[(\bar{x}_k - \hat{x}_k)^2]$, where $\bar{x}_k$ is the true state vector.

The Kalman observer is operable to perform the following calculations during the kth iteration:

$$\epsilon_k = y_k - H\hat{x}_k$$

wherein $\epsilon_k$ is the innovation, the measured output minus the predicted output.

Then the covariance of the innovation, $S_k$, is the sum of the measurement covariance and the prediction covariance as follows:

$$S_k = HP_k H^T + R_k$$

The Kalman gain, $K_k$, is then calculated as follows:

$$K_k = FP_k H^T S^{-1}_k$$

The Kalman observer is advanced one time step and a correction based upon the calculated innovation and the Kalman gain is made as follows:

$$\hat{x}_{k+1} = F\hat{x}_k + K_k \epsilon_k$$

Then the covariance, P, for $\hat{x}_{k+1}$ is calculated as follows:

$$P_{k+1} = F(P_k - P_k H^T S_k^{-1} HP_k)F^T + Q$$

For each new iteration, the Kalman observer must obtain a new measurement $y_k$ and a measurement noise variance $R_k$. In the general case, all other matrices and values can also depend upon the sample k, but, here, such values are constant. If no measurement is available, $R_k$ is set to infinity. Thereby, the covariance of the innovation is also set to infinity, and $K_k = 0$, $\hat{x}_{k+1} = F\hat{x}_k$ and $P_{k+1} = FP_k F^T + Q$.

As a priori knowledge, additional information is not required, except for values of the model matrices F and H, the covariance matrix of the system noise Q, the initial state vector $\hat{x}_0$ and its covariance matrix $P_0$.

To ensure that the Kalman observer is not operable erroneously, the following limitations are introduced into the Kalman observer: 1) The aging per second, $x_2$, may never exceed a normal aging per second value; 2) The maximum correction, $K(y - y_{pred})$, may never exceed the normal drift during three samples (plus the number of samples adherent to this one skipped due to holdover); and 3) If a sequence of measurements is skipped, $x_2$ is divided by two. Such a calculation ensures a robust rather than a fast observer. If a sequence of measurements is skipped, it is reasonable to assume that the value before the skipped sequence was tainted and the derivative of the aging might be badly estimated. In such a case, a long holdover might cause the estimation of $x_1$ to drift away many measurements of aging in the wrong direction. To eliminate totally the risk, $x_2$ should be set to 0 at a holdover. A compromise is to divide $x_2$ as noted.

During operation of the Kalman observer in the performance of the above-listed iterative steps, the standard deviation, σ, of $x_1$ is calculated. The standard deviation value is used to calculate the confidence interval used by the validators utilizing the equation:

threshold=max($k_1\sigma,\sigma_0$)

confidence interval=$x_1$±threshold where $\sigma_0$ and $k_1$ are predefined constants.

If the difference between $x_1$ and the true aging of the actual oscillator is very large, many samples are required before the threshold has grown large enough. Once a measurement has been accepted, the standard deviation, and thereby the threshold, becomes very small. The limitations on updates in the observer do not permit a large-enough correction to get on track, and the Kalman observer is back to its starting point, i.e., large error and small threshold. To prevent an endless loop, after a selected time period of unsuccessful tracking, fast synchronization mode of operation of the Kalman observer is instead initiated.

That is to say, when operation of the Kalman observer unsuccessfully tracks the aging of the oscillator for the selected time period, or when the radio base station is first powered on, the fast synchronization mode is initiated. Utilization of the fast synchronization mode permits the Kalman observer to obtain an estimated x within the vicinity of the true aging of the oscillator. Then, normal operation of the Kalman observer resumes. The fast synchronization mode is based upon the assumption that the Kalman observer can, by itself, handle smaller holdovers since such smaller holdovers cause higher variance and thereby smaller influence. The threshold of the confidence interval can therefore be elevated to become threshold=max($k_2\sigma,\sigma_1$)

confidence interval=$x_1$±threshold wherein $\sigma_1$ and $k_2$ are predefined constants.

Also, when in this mode, the oscillator model is changed to that of a Stratum-3 oscillator to force a higher bandwidth. And, no maximum correction per update is utilized. The fast synchronization mode terminates after a fixed time period, presuming that the estimated aging at such time is within a pre-defined interval. As compensation value generated on line 166, the estimated aging of the stratum 2 oscillator, $x_1$, is provided.

In one embodiment, the altering of compensation value is selectively done responsive to a quality indication of the signal received on line 156. Such a quality indication is typically the fraction of measurements discarded since the last update of compensation value or the standard deviation of the aging, σ. In this way, the quality indication is used to decide whether or not the currently estimated aging of the stratum 2 oscillator by the Kalman observer 154 shall be used as compensation value provided on line 166 or considered to be too unreliable. If considered too unreliable, the compensation value provided on line 166 is not altered.

In one embodiment, the validator 152 is operable to perform outlier rejection of signal portions provided thereto on the line 156. A sequence of the signal provided thereto is stored in a buffer, and the average value, together with its standard deviation value, is calculated for the measurements during a selected time period. The average is compared with a confidence interval provided by way of the loop-back path 158. If the average value is outside of the confidence interval, the value is referred to as an outlier. If the average value is within the confidence interval, the validator accepts the buffered sequence and the average value determined thereat together with its standard deviation is provided to the Kalman observer 154. If the value is determined to be an outlier, the value is discarded and the Kalman observer 154 utilizes its model to update the estimated aging of the oscillator and its standard deviation. A new measurement period is then initiated. The outlier rejection method can be implemented either utilizing a buffer of measurements and then calculating an average and standard deviation, or as a "flying" algorithm.

The average value determined by the validator 152 together with its standard deviation is calculated of measurements made during a selected time period. Storage of sequences in a buffer reduces the need to perform computations at every measurement instant. The average $\xi$ and the standard deviation of the sequence, s, is calculated as follows:

$$\xi = \frac{1}{N} \sum_{k=1}^{N} x_k$$

$$s^2 = \frac{1}{N-1} \sum_{k=1}^{N} (x_k - \xi)^2$$

wherein N is the number of symbols forming a sequence stored in a buffer, and $x_k$ is measurement number k. The variance, Var($\xi$), can be calculated as follows:

$$Var(\xi) = Var\left(\frac{1}{N} \sum_{k=1}^{N} x_k\right) = \frac{1}{N^2} \sum_{k+1}^{N} Var(x_k) = \frac{s^2}{N}$$

The calculated value of the variance of the average is used as the variance of the measurement, and the average is used as the measurement in the Kalman observer 154, conditioned that the average is within the confidence interval of: estimated aging±threshold.

In an alternate embodiment, a non-stationary Kalman observer, based upon a model describing a constant, updated at every measurement instant, is utilized to form the average and its variance of the calculated measurements during a selected time period. If the estimated constant is within the confidence interval, it is, together with its variance, provided to the Kalman observer 154 as measurement and measurement variance.

In another embodiment, the validator 152 validates signals provided thereto by way of the line 156 utilizing a change detection method. In such a method, signal values received at the validator 152 on line 156 during selected time intervals are used to calculate measurements which are stored in a buffer. A change detector is then used to find changes in the buffer that could have been caused by a holdover. The periods of unlikely measurement caused by holdover, or other malfunction, are isolated and discarded. The average of the remaining sequence stored in the buffer, together with its standard deviation, are provided to the Kalman observer 154. Change detection, as shall be noted below, can also be implemented utilizing multiple buffers. Buffer lengths of the buffers are selected so that drifts caused by holdover can be detected.

Figure 6:
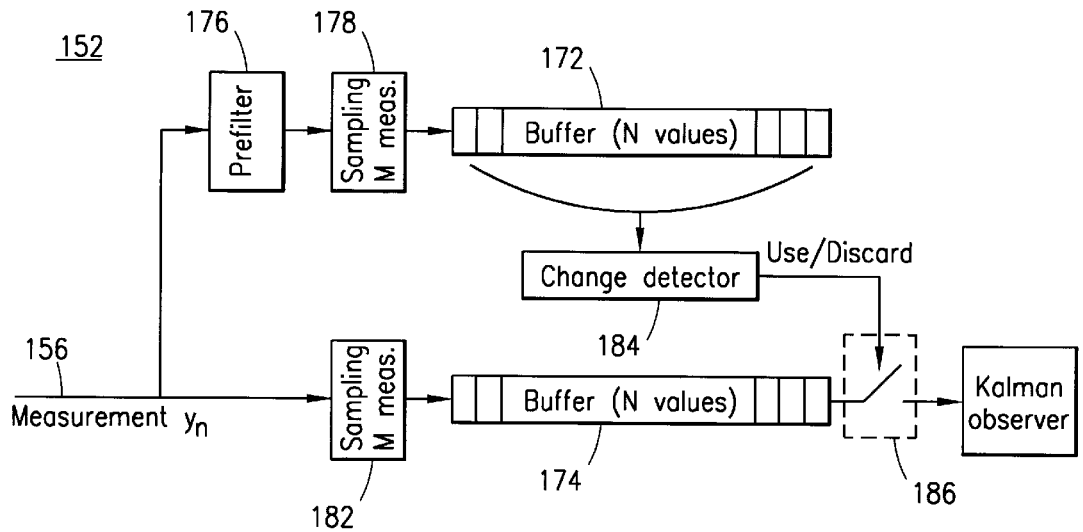
FIG. 6 illustrates a functional block diagram of a portion of an embodiment of the compensation value generator shown in FIG. 5.

FIG. 6 illustrates functionally the validator 152 utilizing a two-buffer method utilizing two buffers, here buffers 172 and 174, each capable of storing N values formed from a signal provided to the validator 152 by way of line 156. The signal provided by way of line 156 is used to form measurements proportional to the average frequency deviation of the reference signal during each sample period. The measurements are filtered by a prefilter 176, sampled by a sampler 178, and sampled signal components are stored in the buffer 172. The measurements are further sampled by a sampler 182 and sampled components are stored in the buffer 174. A change detector 184 detects changes of measurement values of the sampled signal components stored in the buffer 172, as above described. A determination is made by the change detector 184 to use or to discard parts of the stored sequence. Responsive to the determination, a switch element 186 is either closed or opened, thereby to provide selectively indications of the values validated at the validator to the Kalman observer 154.

During operation of the validator 152 of the embodiment illustrated in FIG. 6, the average of every M measurements is stored in the buffers 172 and 174. The measurements stored in the buffer 172 are prefiltered by the prefilter 176 to suppress jitter allowing small low-frequency deviations to be detected, and the measurements stored in the buffer 174 are merely stored thereby preventing the measurements to influence each other. Operation of the change detector 184 on the values stored in the buffer 172 detects low frequency changes of the values stored therein. Responsive to the determinations made by the change detector 184, values stored in the buffer 174 are selectively discarded. Nondiscarded parts are provided to the Kalman observer, i.e., the average and its corresponding variance is provided to the Kalman observer.

Figure 7:
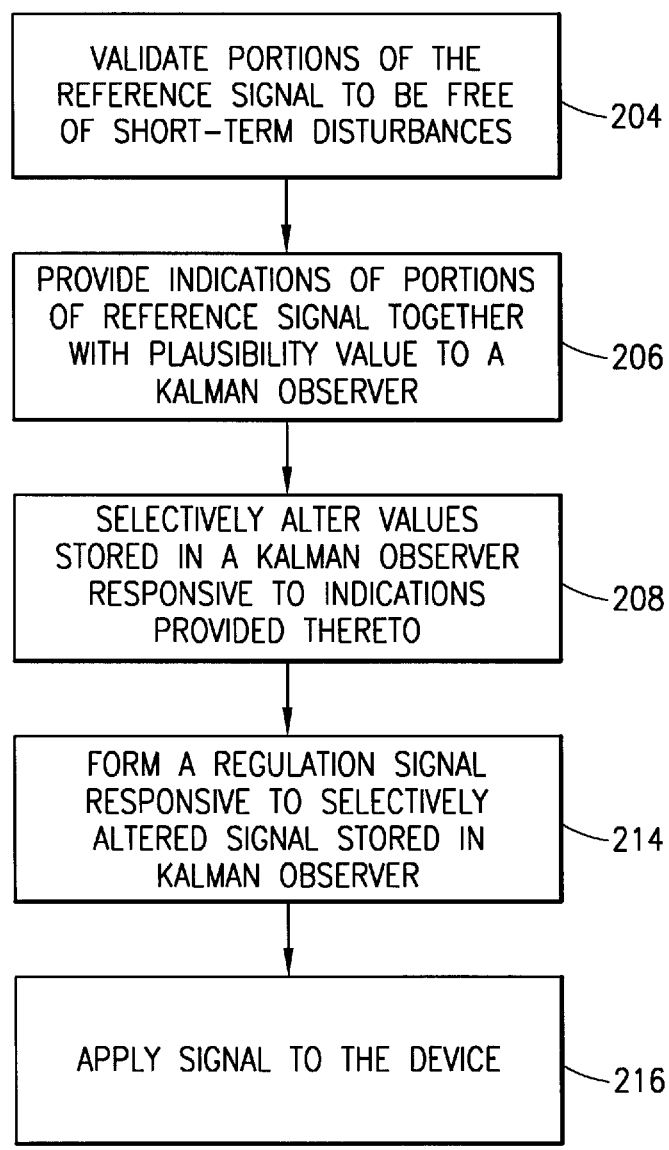
FIG. 7 illustrates a method flow diagram listing the method steps of the method of an embodiment of the present invention detailed description.

FIG. 7 illustrates a method, shown generally at 202, of an embodiment of the present invention. The method calibrates a device responsive to values of a reference signal in which the reference signal is subject to short-term disturbances.

First, and as indicated by the block 204, values of portions of the reference signal are validated to be likely to be free of the short-term disturbances in which a plausibility value is associated with the portions of the reference signal. Then, and as indicated by the block 206, indications of the portions of the reference signal having plausibility values at least as great as a selected amount, together with the plausibility value associated therewith, are provided to a buffer of a Kalman observer.

Then, and as indicated by the block 208, the stored values stored in the Kalman observer are selectively altered responsive to the indications provided thereto. Then, and as indicated by the block 214, a regulation signal is formed responsive to the stored values stored in the Kalman observer. And, as indicated by the block 216, the regulation signal is applied to the device.

Thereby, through operation of an embodiment of the present invention, a device can be calibrated utilizing a reference source having acceptable short-term frequency stability characteristics together with a reference source having acceptable, long-term, frequency stability characteristics.

The previous descriptions are of preferred examples for implementing the invention, and the scope of the invention should not necessarily be limited by this description. The scope of the present invention is defined by the following claims.

What is claimed is:

1. Apparatus for regulating the frequency of an output oscillating signal formed by an oscillator of an oscillating circuit, said apparatus comprising:

a first feedback element coupled to receive the output oscillating signal and to receive a first reference signal, the first reference signal exhibiting short-term frequency stability characteristics of at least as good as a first selected frequency stability level, said first feedback element for forming a first difference signal, the first difference signal representative of deviation of the output oscillating signal relative to the first reference signal;

a second feedback element coupled to receive the output oscillating signal and to receive a second reference signal, the second reference signal exhibiting long-term frequency stability characteristics of at least as good as a second selected frequency stability level, said second feedback element for forming a second difference signal, the second difference signal representative of deviation of the output oscillating signal relative to the second reference signal;

a compensation value generator coupled to receive the second difference signal, said compensation value generator for forming a compensation value signal, the compensation value signal formed responsive to values of the second difference signal when the second reference signal exhibits short-term frequency stability characteristics at least as good as a third selected frequency stability level; and a regulator coupled to receive the first difference signal and at least selectively to receive the compensation value signal, said regulator for modifying the first difference signal responsive to the compensation value signal and for forming a control signal for controlling the frequency of the oscillator.

2. The apparatus of claim 1 wherein the first reference signal exhibits short-term frequency stability characteristics at least as good as a Stratum-2 level.

3. The apparatus of claim 2 further comprising a Stratum-2 oscillator, said Stratum-2 oscillator for generating the first reference signal.

4. The apparatus of claim 1 wherein the second reference signal exhibits long-term frequency stability characteristics at least as good as a Stratum-2 level.

5. The apparatus of claim 4 wherein the oscillating circuit forms a portion of a radio base station of a radio communication system and wherein the second reference signal to which said second feedback element is coupled to receive comprises a network-generated signal.

6. The apparatus of claim 5 wherein the radio communication system comprises a cellular communication system and wherein the second reference signal comprises a PCM clock signal.

7. The apparatus of claim 1 wherein the second reference signal comprises a network-generated signal, and wherein said compensation value generator removes jitter and wander components out of the network-generated signal.

8. The apparatus of claim 7 wherein the oscillating circuit forms a portion of a radio base station of a radio communication system and wherein the network-generated signal comprises a PCM clock signal.

9. The apparatus of claim 7 wherein the oscillating circuit forms a portion of a radio base station of a radio communication system and wherein the network-generated signal comprises a clock signal received at a GPS receiver operable in a GPS network.

10. The apparatus of claim 8 wherein said compensation value generator includes a Kalman observer and a measurement validator, said Kalman observer for estimating frequency deviation of the first reference signal and said measurement validator for validating values of the second difference signal.

11. The apparatus of claim 10 further comprising a Stratum-2 oscillator for generating the first reference signal, wherein the first reference signal is susceptible to frequency deviation due to aging of the Stratum-2 oscillator, and wherein estimates of the first reference source estimated by said Kalman observer comprise estimates of the frequency deviation due to aging of the Stratum-2 oscillator.

12. The apparatus of claim 10 wherein said measurement validator validates measurements by performing change detection computations upon the second difference signal.

13. The apparatus of claim 10 wherein said measurement validator validates values of the second difference signal which are determined to deviate from an estimated value less than a selected amount.

14. The apparatus of claim 10 wherein said measurement validator comprises processing apparatus having a measurement validation algorithm executable therein, the measurement validation algorithm, when executed, for validating measurements received during a selected time interval and for providing plausibility signals associated with the measurements indicative thereof to the Kalman observer.

15. The apparatus of claim 14 further comprising a measurement-validator buffer for storing values of the measurements therein; the values stored therein permitting, when analyzed, performance of drift analysis.

16. The apparatus of claim 15 wherein said buffer comprises a plurality of buffers, values stored in the plurality of buffers for permitting different levels of filtering.

17. The apparatus of claim 16 wherein the measurements are validated by said measurement validator if the measurements are within a loop-back confidence interval provided to the measurement validator by the Kalman observer.

18. The apparatus of claim 17 wherein said measurement validator further determines whether values indicative of the second difference signal are unlikely to be accurate, and selectively provides the values indicative of the second difference signal to the Kalman observer responsive thereto.

19. The apparatus of claim 10 wherein said Kalman observer has a bandwidth associated therewith and wherein said Kalman observer utilizes multiple models of the Stratum-2 oscillator aging to vary the bandwidth associated with said Kalman observer.

20. The apparatus of claim 10 wherein said Kalman observer has associated therewith correction levels and state variables, and wherein successive estimations made by said Kalman observer are within-maximum correction levels and within-maximum state variables.

21. The apparatus of claim 10 wherein updating of compensation values is selectively made responsive to indications of quality levels of the second reference signal.

22. The apparatus of claim 21 wherein the indications of the quality levels comprise indications of standard deviations of an aging estimate.

23. The apparatus of claim 1 wherein said compensation value generator comprises processing apparatus having a calibration algorithm executable therein, the calibration algorithm, when executed, for forming values of the compensation value signal.

24. A method for regulating the frequency of an output oscillating signal formed by an oscillator of an oscillating circuit, said method comprising the steps of:

forming a first difference signal representative of deviation of the output oscillating signal relative to a first reference signal, the first reference signal exhibiting short-term frequency stability characteristics of at least as good as a first selected frequency stability level;

forming a second difference signal representative of deviation of the output oscillating signal relative to a second reference signal, the second reference signal exhibiting long-term frequency stability characteristics of at least as good as a second selected frequency stability level;

forming a compensation value signal responsive to values of the second difference signal when the second reference signal exhibits short-term frequency stability characteristics at least as good as a third selected frequency stability level;

selectively modifying the first difference signal responsive to the compensation value signal to form a control signal; and applying the control signal to adjust the frequency of oscillation of the oscillator.

* * * * *